United States Patent
Shimizu (10) Patent No.: US 12,107,569 B2
(45) Date of Patent: Oct. 1, 2024

(54) SEMICONDUCTOR DEVICE

(71) Applicant: FUJI ELECTRIC CO., LTD., Kawasaki (JP)

(72) Inventor: Naoki Shimizu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 4 days.

(21) Appl. No.: 18/191,196

(22) Filed: Mar. 28, 2023

(65) Prior Publication Data

US 2023/0344423 A1 Oct. 26, 2023

(30) Foreign Application Priority Data

Apr. 26, 2022 (JP) ................................. 2022-072581

(51) Int. Cl.
*H03K 17/0812* (2006.01)
*H03K 17/08* (2006.01)

(52) U.S. Cl.
CPC . *H03K 17/08122* (2013.01); *H03K 17/08128* (2013.01); *H03K 2017/0806* (2013.01)

(58) Field of Classification Search
CPC ......... H03K 17/0812; H03K 17/08122; H03K 17/08128; H03K 2017/0806
USPC ........................................ 327/512, 513, 574
See application file for complete search history.

(56) References Cited

U.S. PATENT DOCUMENTS

| | | | | |
|---|---|---|---|---|
| 5,543,996 A * | 8/1996 | Nakago | ................. | H02H 5/044 361/103 |
| 2010/0263644 A1 * | 10/2010 | Matsuda | ................. | F02P 9/005 123/625 |
| 2013/0060499 A1 * | 3/2013 | Yoshimura | ............... | G01K 7/01 702/99 |
| 2017/0077919 A1 | 3/2017 | Nakamori | | |
| 2018/0175849 A1 * | 6/2018 | Shimizu | ................. | H03K 17/14 |
| 2018/0367023 A1 | 12/2018 | Terashima | | |
| 2019/0103863 A1 * | 4/2019 | Inada | ...................... | H02M 1/32 |
| 2022/0069815 A1 * | 3/2022 | Minagawa | ......... | H03K 17/0828 |
| 2023/0378951 A1 * | 11/2023 | Kumazawa | ............ | H03K 17/14 |
| 2023/0387904 A1 * | 11/2023 | Kurosawa | ........ | H03K 17/08128 |
| 2024/0142511 A1 * | 5/2024 | Kumazawa | ........ | G01R 31/2619 |

FOREIGN PATENT DOCUMENTS

WO 2016/103929 A1 6/2016
WO 2018/042939 A1 3/2018

* cited by examiner

*Primary Examiner* — William Hernandez
(74) *Attorney, Agent, or Firm* — Rabin & Berdo, P.C.

(57) ABSTRACT

A semiconductor device including: an output element connected to a load and configured to perform switching to operate the load; a drive circuit configured to output a drive signal to thereby cause the output element to perform the switching; an external terminal configured to be connected to a constant current source that is external to the semiconductor device, and to receive a constant current from the constant current source; a temperature sensor connected to the external terminal, and configured to operate with the constant current, detect a temperature of the output element, and output a temperature detection value; a temperature state detection circuit configured to output a temperature state of the output element, based on a result of comparing the temperature detection value with a reference threshold; and an abnormal level notification circuit configured to send out a notification upon determining that the temperature state is at an abnormal level.

10 Claims, 9 Drawing Sheets

SEMICONDUCTOR DEVICE

CROSS-REFERENCE TO RELATED APPLICATION

This application is based upon and claims the benefit of priority of the prior Japanese Patent Application No. 2022-072581, filed on Apr. 26, 2022, the entire contents of which are incorporated herein by reference.

BACKGROUND OF THE INVENTION

1. Field of the Invention

The embodiments discussed herein relate to a semiconductor device having a protection function of protecting a power semiconductor element.

2. Background of the Related Art

Semiconductor devices called intelligent power modules (IPMs) have been developed, in which power semiconductor elements such as insulated gate bipolar transistors (IGBTs), drive circuits for driving the power semiconductor elements, and others are built.

For example, IPMs are widely used in numerical control (NC) machine tools, industrial robots, elevators, and others, and products that achieve size reduction, high performance, and high reliability have been desired.

In addition, IPMs have a protection function of monitoring a current flowing through a power semiconductor element, the chip temperature of the power semiconductor element, and others, and protecting the power semiconductor element on the basis of the monitoring results so as not to damage the power semiconductor element.

Figure 9:
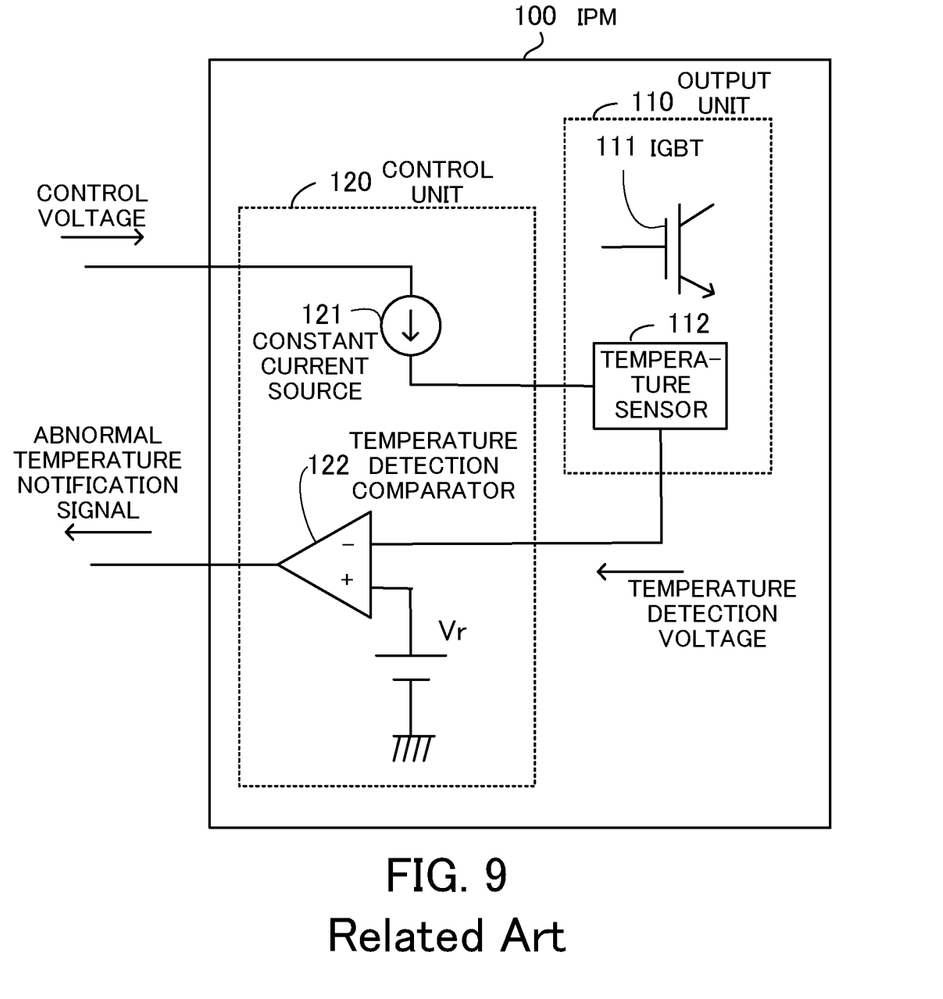
FIG. 9 is a view for describing an example of an overheat protection function provided in a conventional intelligent power module (IPM).

FIG. 9 is a view for describing an example of an overheat protection function provided in a conventional IPM. The IPM 100 includes an output unit 110 including an IGBT 111 and a temperature sensor 112 and a control unit 120 including a constant current source 121 and a temperature detection comparator 122.

The constant current source 121 outputs a constant current based on a control voltage input to the IPM 100. The temperature sensor 112 is disposed in the vicinity of the IGBT 111, and is configured to detect the temperature state of the IGBT 111 on the basis of the constant current output from the constant current source 121 while the IGBT 111 operates and to output a temperature detection voltage.

The temperature detection comparator 122 compares the temperature detection voltage output from the temperature sensor 112 with the voltage level of a reference threshold Vr. Then, when detecting based on the comparison result that the temperature state of the IGBT 111 is an overheat state, the temperature detection comparator 122 outputs an abnormal temperature notification signal indicating the abnormal temperature state.

As related art, there has been proposed a technique of outputting, upon detecting that a detected temperature has reached a threshold temperature, an advance warning signal before activating overheat protection (see, for example, International Publication Pamphlet No. 2016/103929). In addition, there has been proposed a technique of selecting and outputting from an alarm terminal of a drive device a signal identifying a factor of abnormality and a signal indicating that the factor of abnormality continues (see, for example, International Publication Pamphlet No. 2018/042939).

In the overheat protection function of the IPM 100 described above, a temperature detection level at which the abnormal temperature notification signal indicating the abnormal temperature state is output is set based on the value of the constant current output from the constant current source 121.

Conventionally, the value of the constant current is determined and set at the manufacturing stage and is fixed in the IPM 100. Therefore, there occurs a problem that it is difficult to flexibly change the temperature detection level for making a notification of an abnormal temperature state to a value that is desired by a customer or for application.

SUMMARY OF THE INVENTION

According to one aspect, there is provided a semiconductor device for operating a load, including: an output element connected to the load and configured to perform switching to operate the load; a drive circuit configured to output a drive signal to the output element, to thereby cause the output element to perform the switching; an external terminal configured to be connected to a constant current source that is external to the semiconductor device, and to receive a constant current output from the constant current source; a temperature sensor connected to the external terminal and configured to operate with the constant current, detect a temperature of the output element, and output a temperature detection value; a temperature state detection circuit configured to output a temperature state of the output element, based on a result of comparing the temperature detection value with a reference threshold; and an abnormal level notification circuit configured to send out a notification upon determining that the temperature state is at an abnormal level.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. Note that the same reference numerals may be given to elements having substantially the same functions in the specification and drawings so as to omit the overlapping description.

First Embodiment

Figure 1:
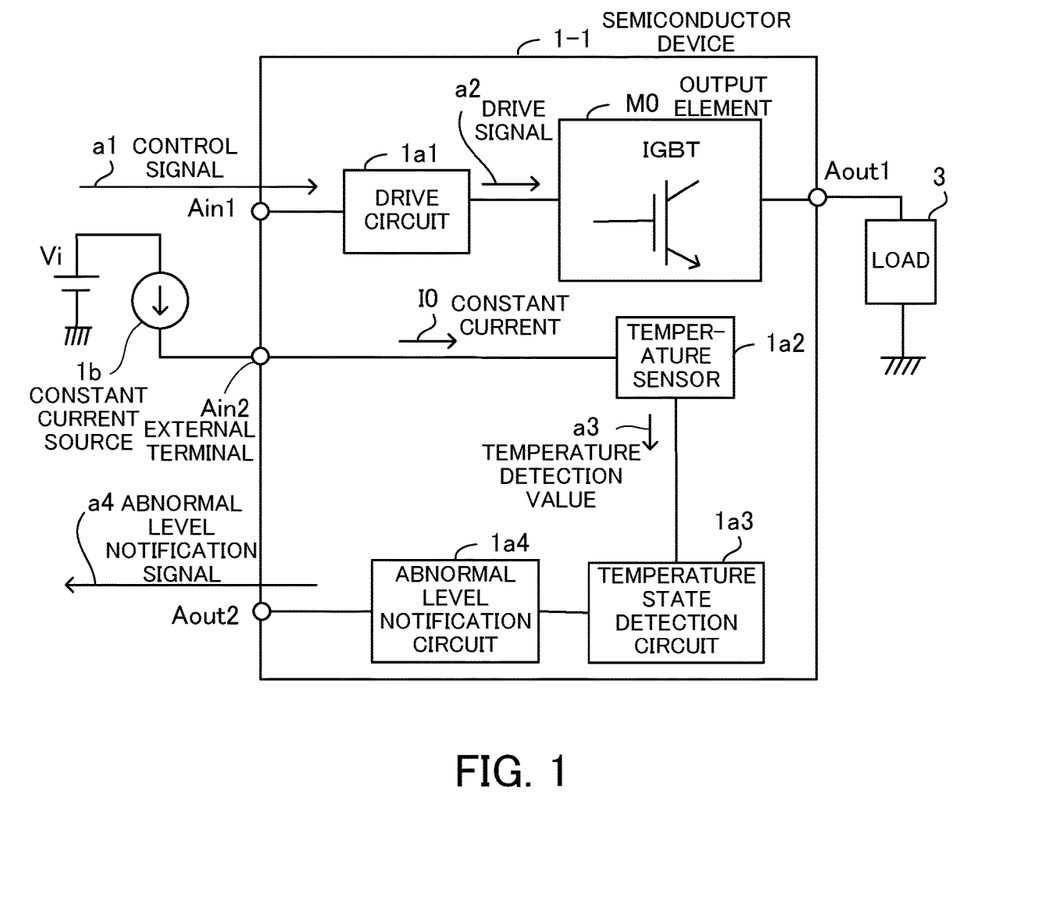
FIG. 1 is a view for describing an example of a semiconductor device according to a first embodiment.

FIG. 1 is a view for describing an example of a semiconductor device according to a first embodiment. The semiconductor device 1-1 includes an output element M0, a drive circuit 1a1, a temperature sensor 1a2, a temperature state detection circuit 1a3, and an abnormal level notification circuit 1a4. In addition, the semiconductor device 1-1 includes an input terminal Ain1, an external terminal Ain2, and output terminals Aout1 and Aout2.

The output element M0 is a voltage-controlled semiconductor element such as an insulated gate bipolar transistor (IGBT) or a metal-oxide-semiconductor field-effect transistor (MOSFET). The output element M0 is connected to a load 3 via the output terminal Aout1, and performs switching to operate the load 3. For example, the load 3 is an inductive load such as a solenoid valve, which is widely used in automobiles and others.

The drive circuit 1a1 receives a control signal a1 sent from, for example, a microcomputer via the input terminal Ain1. The drive circuit 1a1 generates a drive signal a2 for turning on or off the output element M0 on the basis of the control signal a1, and outputs the drive signal a2 to the output element M0 to cause the output element M0 to perform the switching.

The temperature sensor 1a2 operates with a constant current I0 received from the external terminal Ain2, detects the temperature of the output element M0, and outputs a temperature detection value a3. The temperature state detection circuit 1a3 compares the temperature detection value a3 with a reference threshold, and detects based on the comparison result whether the temperature state of the output element M0 is an abnormal level.

When the temperature state detection circuit 1a3 detects the abnormal level, the abnormal level notification circuit 1a4 outputs an abnormal level notification signal a4 via the output terminal Aout2 to make a notification of the occurrence of the overheat state to the outside.

The semiconductor device 1-1 includes the external terminal Ain2 as a new terminal. The external terminal Ain2 is connected to a constant current source 1b and is configured to receive from the outside the constant current I0 output from the constant current source 1b. The input terminal of the constant current source 1b is connected to a voltage source Vi, and the output terminal of the constant current source 1b is connected to the external terminal Ain2. The constant current I0 output from the constant current source 1b is input to the temperature sensor 1a2.

As described above, the semiconductor device 1-1 has a configuration such that the constant current I0 to be input to the temperature sensor 1a2 used for detecting the overheat state of the output element M0 is output from the constant current source 1b provided outside the semiconductor device 1-1, so as to control the temperature detection level on the basis of the constant current I0 received via the external terminal Ain2. This configuration makes it possible to flexibly and easily change the temperature detection level at which a notification of an abnormal temperature state is made in the overheat protection function.

(Configuration of Semiconductor Device)

Figure 2:
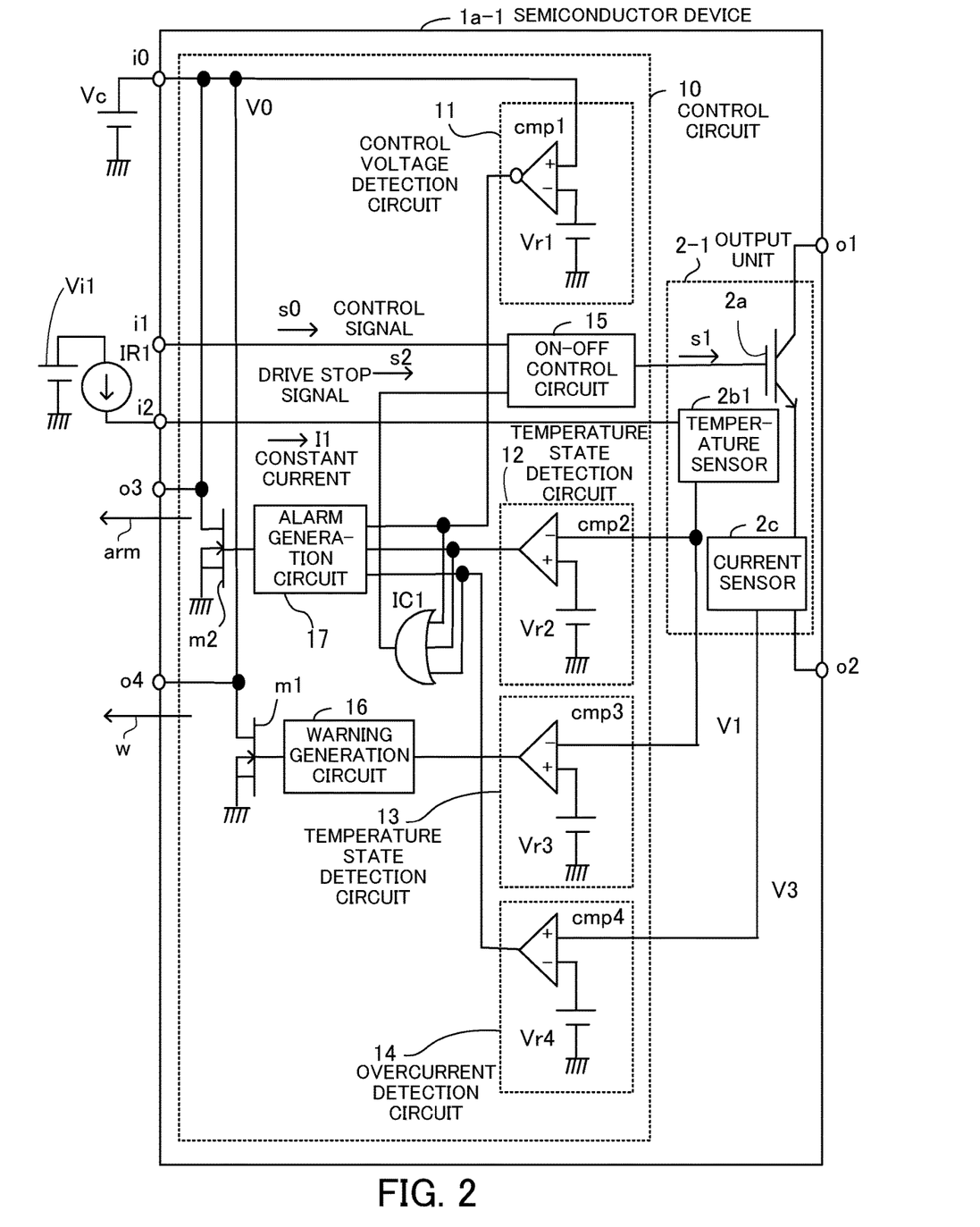
FIG. 2 illustrates an example of the configuration of a semiconductor device.

The following describes a detailed configuration of a semiconductor device to which the function of the semiconductor device 1-1 is applied. FIG. 2 illustrates an example of the configuration of a semiconductor device. For example, the semiconductor device 1a-1 is applied to an intelligent power module (IPM). The semiconductor device 1a-1 includes input terminals i0 and i1, an external terminal i2, and output terminals o1, . . . , o4 as input and output terminals, and also includes a control circuit 10 and an output unit 2-1.

The output unit 2-1 includes an IGBT 2a, a temperature sensor 2b1, and a current sensor 2c. The control circuit 10 includes a control voltage detection circuit 11, temperature state detection circuits 12 and 13, an overcurrent detection circuit 14, an on-off control circuit 15, a warning generation circuit 16, and an alarm generation circuit 17. In addition, the control circuit 10 includes an OR element IC1 with three inputs and one output, and N-channel metal-oxide semiconductor (NMOS) transistors m1 and m2 that are N-channel MOSFETs.

In this connection, the temperature state detection circuits 12 and 13 implement the function of the temperature state detection circuit 1a3 of FIG. 1. In addition, the warning generation circuit 16 and alarm generation circuit 17 implement the function of the abnormal level notification circuit 1a4 of FIG. 1.

The control voltage detection circuit 11 includes a comparator cmp1 and a reference power supply that outputs a reference voltage Vr1, and the temperature state detection circuit 12 includes a comparator cmp2 and a reference power supply that outputs a reference voltage Vr2.

The temperature state detection circuit 13 includes a comparator cmp3 and a reference power supply that outputs a reference voltage Vr3, and the overcurrent detection circuit 14 includes a comparator cmp4 and a reference power supply that outputs a reference voltage Vr4.

The output unit 2-1 includes an IGBT 2a the collector of which is connected to the output terminal o1 and the emitter of which is connected to the output terminal o2. In this connection, in the case where the IGBT 2a is formed as a high-side device (in the case where the semiconductor device 1a-1 is used as a high-side IPM), a positive electrode power supply (P-side power supply) is connected to the output terminal o1, and a load is connected to the output terminal o2.

In the case where the IGBT 2a is formed as a low-side device (in the case where the semiconductor device 1a-1 is used as a low-side IPM), on the other hand, a load is connected to the output terminal o1, and a negative electrode power supply (N-side power supply) is connected to the output terminal o2.

A constant current source IR1 is connected to the external terminal i2. The input terminal of the constant current source IR1 is connected to a voltage source Vi1, and the output terminal of the constant current source IR1 is connected to the external terminal i2. A constant current I1 output from the constant current source IR1 is input to the temperature sensor 2b1 in the output unit 2-1.

The temperature sensor 2b1 receives the constant current I1 from the constant current source IR1 connected to the external terminal i2 of the semiconductor device 1a-1, and outputs a voltage signal V1 based on the operating temperature of the IGBT 2a.

In this case, the voltage level of the voltage signal V1, which the temperature sensor 2b1 outputs, decreases as the operating temperature of the IGBT 2a increases. For example, a multistage temperature detection diode is used as the temperature sensor 2b1.

The current sensor 2c measures a current flowing through the emitter of the IGBT 2a and outputs a voltage signal V3 based on the measurement result. In this case, the voltage level of the voltage signal V3, which the current sensor 2c outputs, increases as the current flowing through the emitter of the IGBT 2a increases.

A control voltage power supply Vc is connected to the input terminal i0, and a control voltage V0 applied by the control voltage power supply Vc is used as a power supply voltage for the control circuit 10. In the control voltage detection circuit 11, the control voltage V0 is supplied to the non-inverting input terminal (+) of the comparator cmp1, and the reference voltage Vr1 (control voltage detection reference threshold) is supplied to the inverting input terminal (−) of the comparator cmp1.

The comparator cmp1 outputs an H-level signal (negative logic output) when the level of the control voltage V0 falls below the reference voltage Vr1. The output of the H-level signal from the comparator cmp1 indicates that a control voltage drop state is an abnormal level.

In addition, a microcomputer, not illustrated, is connected to the input terminal i1, and a pulse control signal s0 output from the microcomputer is input to one input terminal of the on-off control circuit 15. The on-off control circuit 15 generates a drive signal s1 for driving the IGBT 2a on the basis of the control signal s0, and outputs the drive signal s1 to the gate of the IGBT 2a.

In the temperature state detection circuit 13 (first temperature state detection circuit), the reference voltage Vr3 (first reference threshold) is supplied to the non-inverting input terminal (+) of the comparator cmp3, and the voltage signal V1 indicating the temperature state of the IGBT 2a is input to the inverting input terminal (−) of the comparator cmp3.

The comparator cmp3 outputs an H-level signal to the warning generation circuit 16 when the level of the voltage signal V1 falls below the reference voltage Vr3. The output of the H-level signal from the comparator cmp3 indicates that the operating temperature of the IGBT 2a is in an overheat warning state, which is a first temperature state.

When receiving the H-level signal from the comparator cmp3, the warning generation circuit 16 generates an H-level warning signal and outputs it to the gate of the NMOS transistor m1.

The control voltage V0 is applied to the drain of the NMOS transistor m1, and the source of the NMOS transistor m1 is connected to GND. Therefore, when the H-level warning signal is input to the gate of the NMOS transistor m1, the NMOS transistor m1 is turned on.

When the NMOS transistor m1 is turned on, a warning notification signal (an advance warning signal) w is output from the output terminal o4 connected to the drain of the NMOS transistor m1. For example, the warning notification signal w is received by the microcomputer, which then notifies a user of the warning.

In the temperature state detection circuit 12 (second temperature state detection circuit), the reference voltage Vr2 (second reference threshold) is supplied to the non-inverting input terminal (+) of the comparator cmp2, and the voltage signal V1 indicating the temperature state of the IGBT 2a is input to the inverting input terminal (−) of the comparator cmp2.

The comparator cmp2 outputs an H-level signal to the alarm generation circuit 17 when the level of the voltage signal V1 falls below the reference voltage Vr2. The output of the H-level signal from the comparator cmp2 indicates that the operating temperature of the IGBT 2a is in an overheat alarm state, which is a second temperature state.

The refence voltage Vr2 here has a level lower than that of the reference voltage Vr3. Therefore, when the level of the voltage signal V1 further drops from the reference voltage Vr3 indicating the warning level to the reference voltage Vr2 or lower, an H-level signal is output from the comparator cmp2. More specifically, when the operating temperature of the IGBT 2a further rises from the overheat warning state to the overheat alarm state, the H-level signal is output from the comparator cmp2.

In the overcurrent detection circuit 14, the voltage signal V3 indicating the current state of the IGBT 2a is input to the non-inverting input terminal (+) of the comparator cmp4, and the reference voltage Vr4 (overcurrent detection reference threshold) is supplied to the inverting input terminal (−) of the comparator cmp4. The comparator cmp4 outputs an H-level signal (abnormal overcurrent level) to the alarm generation circuit 17 when the level of the voltage signal V3 rises above the reference voltage Vr4. The output of the H-level signal from the comparator cmp4 indicates that the IGBT 2a is in an overcurrent state.

The alarm generation circuit 17 receives an output signal of the comparator cmp1 in the control voltage detection circuit 11, an output signal of the comparator cmp2 in the temperature state detection circuit 12, and an output signal of the comparator cmp4 in the overcurrent detection circuit 14. The alarm generation circuit 17 generates and outputs an H-level alarm signal when at least one of the control voltage drop state, overheat alarm state, and overcurrent state is an abnormal state.

In this case, the alarm generation circuit 17 generates the H-level alarm signal and outputs it to the gate of the NMOS transistor m2 when receiving an H-level signal from at least one of the comparators cmp1, cmp2, and cmp4.

The control voltage V0 is applied to the drain of the NMOS transistor m2, and the source of the NMOS transistor m2 is connected to GND. Therefore, when an H-level alarm signal is input to the gate of the NMOS transistor m2, the NMOS transistor m2 is turned on.

When the NMOS transistor m2 is turned on, an alarm notification signal (warning signal) arm is output from the output terminal o3 connected to the drain of the NMOS transistor m2. The alarm notification signal arm is a notification signal that indicates a warning level higher than that of the warning notification signal w. The alarm notification signal is received by, for example, the microcomputer, which then notifies the user of the alarm.

In this connection, the alarm generation circuit 17 generates alarm notification signals arm with different pulse widths for the control voltage drop state, overheat alarm state, and overcurrent state. For example, the pulse width of an alarm notification signal arm (overcurrent warning signal) in overcurrent protection has a typical value of 2 ms, the pulse width of an alarm notification signal arm (control voltage drop warning signal) in control voltage drop protection has a typical value of 4 ms, and the pulse width of an alarm notification signal arm (temperature warning signal) in overheat protection has a typical value of 8 ms.

Since alarm notification signals arm with different pulse widths are output according to factors for the control voltage drop state, overheat alarm state, and overcurrent state, as described above, the user is able to easily recognize which abnormal state an alarm notification signal arm is for.

The OR element IC1 has three input terminals that receive an output signal of the comparator cmp1 in the control voltage detection circuit 11, an output signal of the comparator cmp2 in the temperature state detection circuit 12, and an output signal of the comparator cmp4 in the overcurrent detection circuit 14.

Therefore, when at least one of the control voltage drop state, overheat alarm state, and overcurrent state is an abnormal state, the OR element IC1 outputs an H-level drive stop signal s2. The output terminal of the OR element IC1 is connected to the other input terminal of the on-off control circuit 15.

When receiving the H-level drive stop signal s2 output from the OR element IC1, the on-off control circuit 15 outputs an L-level drive signal s1 to the gate of the IGBT 2a to turn off the IGBT 2a, so that the IGBT 2a stops operating.

(Change in Temperature Detection Level Based on Change in Constant Current)

Figure 3:
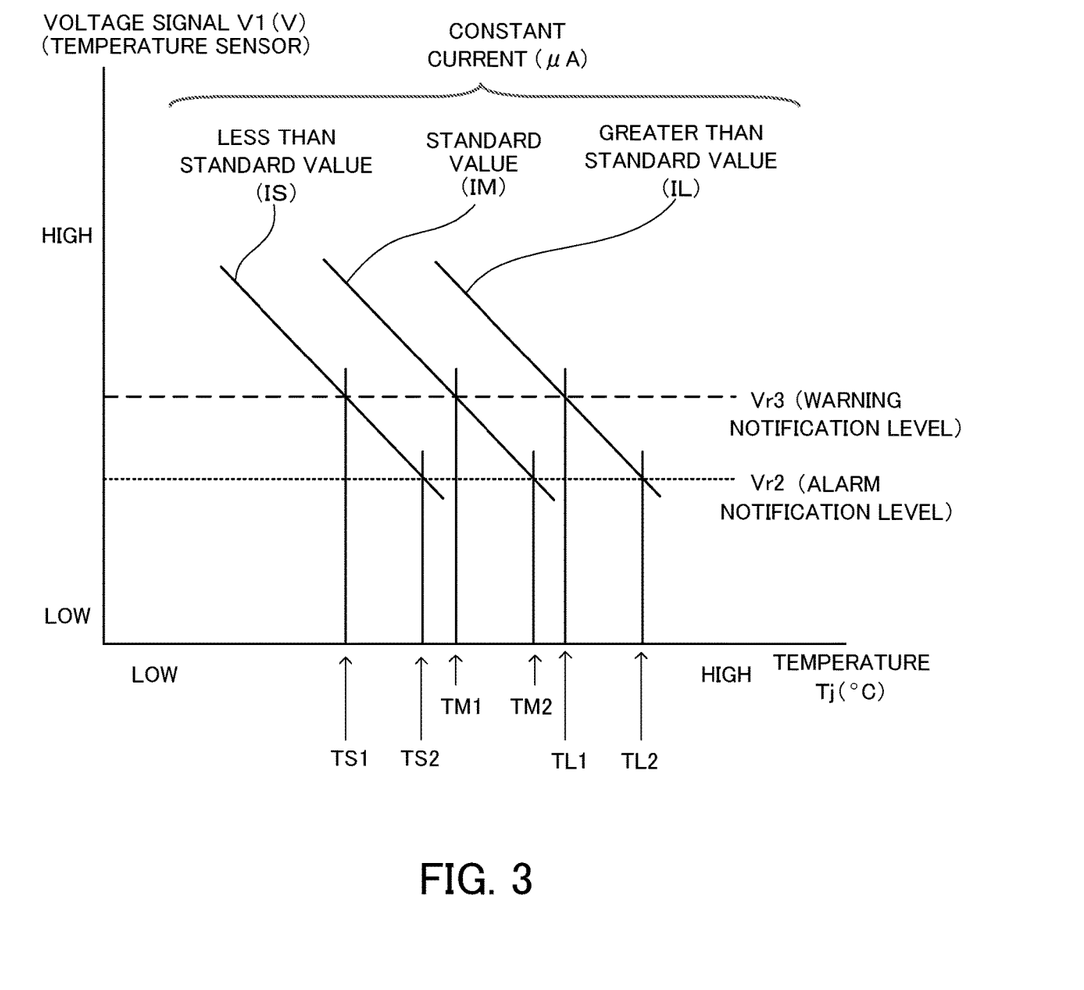
FIG. 3 is a view for describing a situation in which a temperature detection level is changed based on a change in constant current.

FIG. 3 is a view for describing a situation in which a temperature detection level is changed based on a change in constant current. The vertical axis represents the voltage value (V) of the voltage signal V1 that is output from the temperature sensor 2b1, whereas the horizontal axis represents the temperature Tj (° C.) of the IGBT 2a. In addition, FIG. 3 represents changes in the temperature detection level for three patterns of the value (μA) of the constant current I1 that is output from the constant current source IR1. In this connection, the temperatures TS1, TS2, TM1, TM2, TL1 and TL2 in FIG. 3 have a magnitude relationship of TS1<TS2<TM1<TM2<TL1<TL2.

(Constant Current I1 of Standard Value)

Consider the case where the constant current I1 output from the constant current source IR1 has a standard value (referred to as a constant current IM). A warning notification level is when the voltage signal V1 reaches the reference voltage Vr3 of the temperature state detection circuit 13 that is reached at the temperature TM1, and an alarm notification level is when the voltage signal V1 reaches the reference voltage Vr2 of the temperature state detection circuit 12 that is reached at the temperature TM2.

(Constant Current I1 Whose Value is Less than Standard Value)

Consider the case where the constant current I1 output from the constant current source IR1 is less than the standard value (referred to as a constant current IS). The warning notification level is when the voltage signal V1 reaches the reference voltage Vr3 of the temperature state detection circuit 13 that is reached at the temperature TS1, and the alarm notification level is when the voltage signal V1 reaches the reference voltage Vr2 of the temperature state detection circuit 12 that is reached at the temperature TS2.

(Constant Current I1 Whose Value is Greater than Standard Value)

Consider the case where the constant current I1 output from the constant current source IR1 is greater than the standard value (referred to as a constant current IL). The warning notification level is when the voltage signal V1 reaches the reference voltage Vr3 of the temperature state detection circuit 13 that is reached at the temperature TL1, and the alarm notification level is when the voltage signal V1 reaches the reference voltage Vr2 of the temperature state detection circuit 12 that is reached at the temperature TL2.

As described above, when the constant current I1 to be output from the constant current source IR1 is changed from the standard value IM to the value IS less than the standard value IM, the temperature at which the warning notification is made is accordingly changed from the temperature TM1 to the temperature TS1 lower than the temperature TM1. In addition, the temperature at which the alarm notification is made is also changed from the temperature TM2 to the temperature TS2 lower than the temperature TM2.

When the constant current I1 to be output from the constant current source IR1 is changed from the standard value IM to the value IL greater than the standard value IM, the temperature at which the warning notification is made is accordingly changed from the temperature TM1 to the temperature TL1 higher than the temperature TM1. In addition, the temperature at which the alarm notification is made is also changed from the temperature TM2 to the temperature TL2 higher than the temperature TM2.

As described above, the present embodiment uses the constant current source 1b provided outside the semiconductor device to variably set the constant current I0 that is input to the temperature sensor 1a2. Therefore, it is possible to flexibly and easily change the temperature detection level at which a notification of an abnormal temperature state is made in the overheat protection function.

(Relationship Between the Characteristics and Detection Sensitivity of Temperature Detection Diode)

Figure 4:
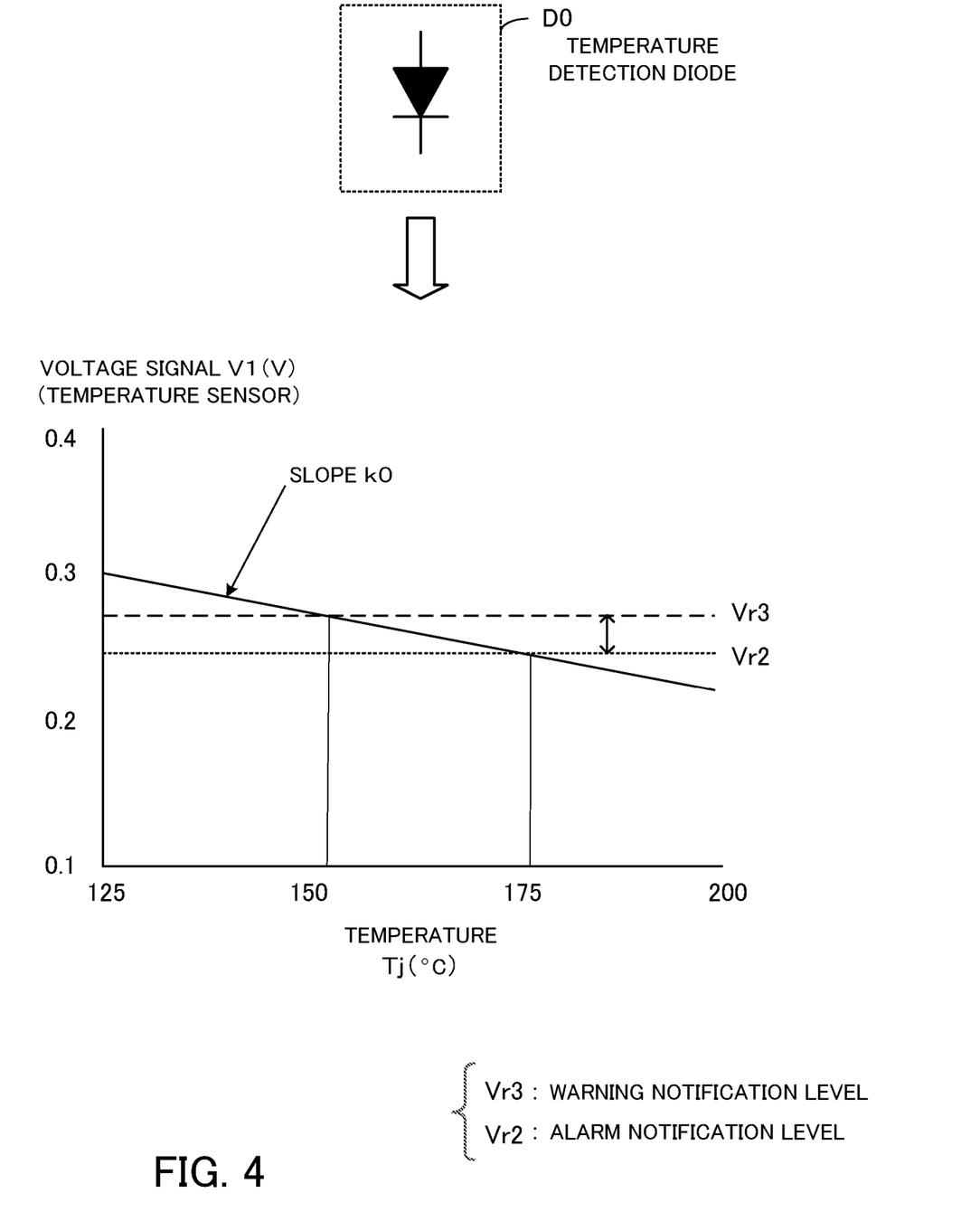
FIG. 4 illustrates the relationship between a voltage signal output from a temperature sensor and the temperature of an insulated gate bipolar transistor (IGBT)
Figure 5:
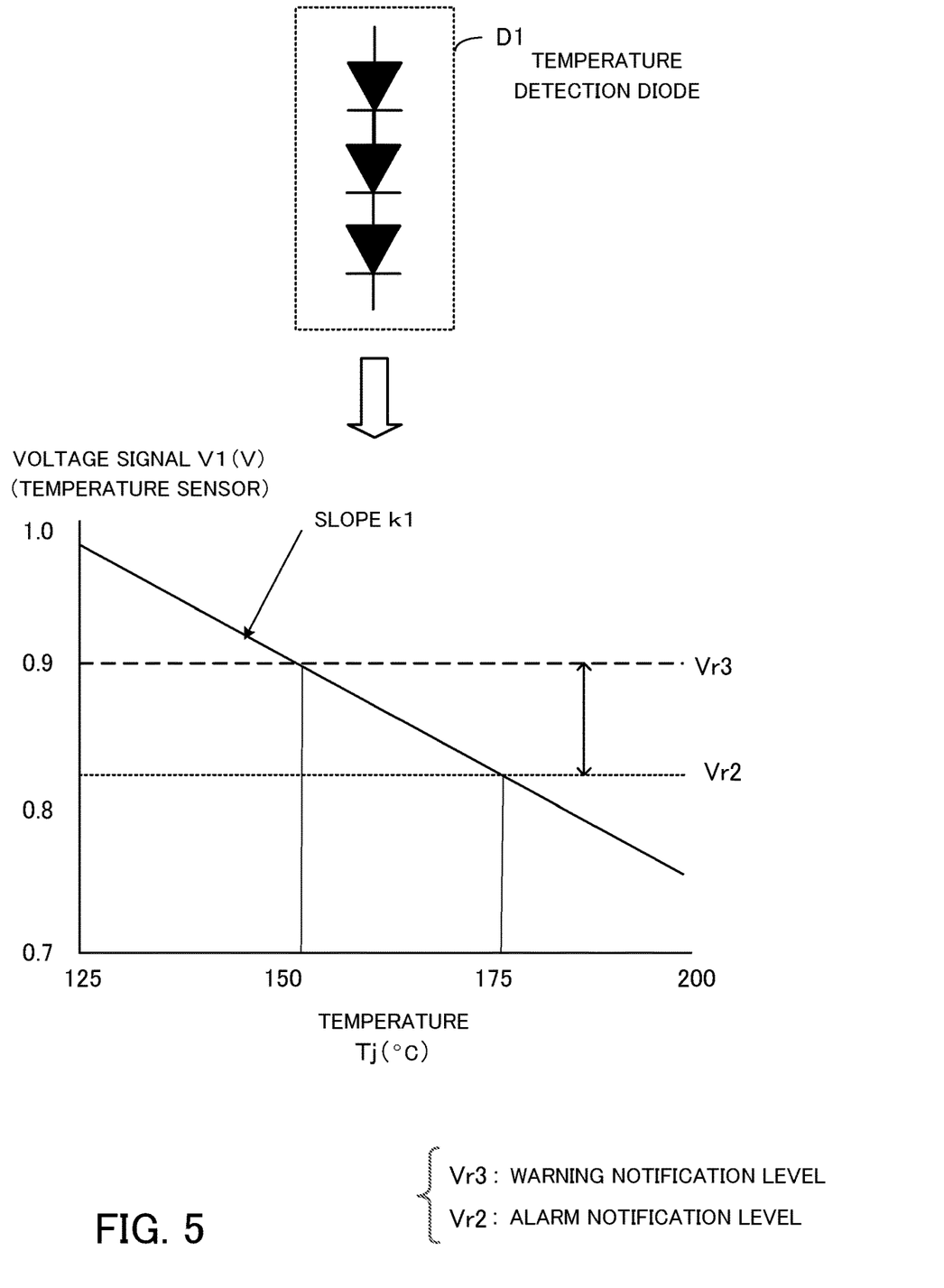
FIG. 5 illustrates the relationship between a voltage signal output from a temperature sensor and the temperature of the IGBT.

FIGS. 4 and 5 represent the relationship between a voltage signal output from a temperature sensor and the temperature of an IGBT. The vertical axis represents the voltage value (V) of the voltage signal V1 output from the temperature sensor 2b1, whereas the horizontal axis represents the temperature Tj (° C.) of the IGBT 2a. In this connection, the slope of the voltage signal V1 is represented as a ratio, not as actual measurement.

FIG. 4 represents the relationship between the voltage signal V1 and the temperature of the IGBT 2a in the case where a one-stage temperature detection diode D0 is used as the temperature sensor 2b1, and the voltage signal V1 has a slope of k0.

On the other hand, FIG. 5 represents the relationship between the voltage signal V1 and the temperature of the IGBT 2a in the case where a three-stage temperature detection diode D1 is used as the temperature sensor, and the voltage signal V1 has a slope of k1 that is approximately three times the slope of k0. That is to say, the detection sensitivity may be increased by increasing the number of stages in the temperature detection diode.

(Relationship Between Alarm Output and Warning Output)

Figure 6:
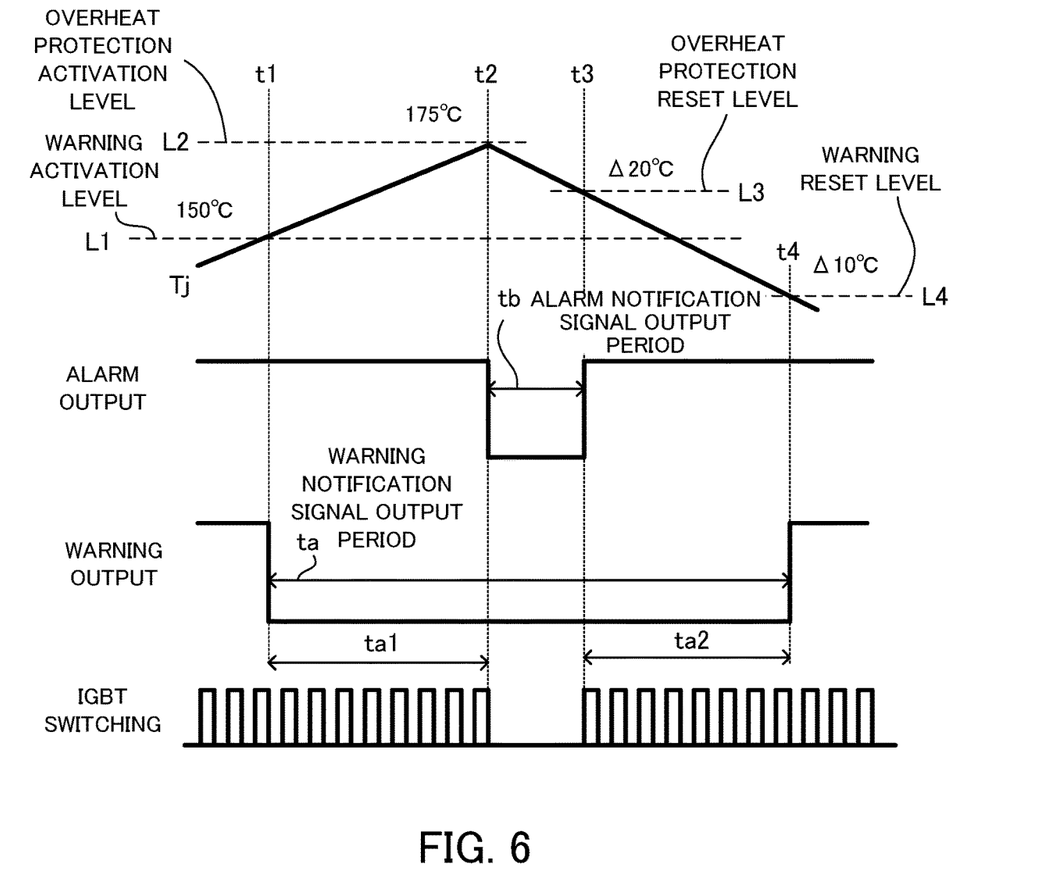
FIG. 6 illustrates an example of the relationship between alarm output and warning output in overheat protection.

FIG. 6 illustrates an example of the relationship between alarm output and warning output in overheat protection.

(Time t1) When the operating temperature Tj of the IGBT 2a has reached a warning activation level L1 (for example, 150° C.), a warning notification signal w is output. In this connection, the IGBT 2a continues its switching operation during time periods ta1 and ta2 during which the warning notification signal w is output but an alarm notification signal arm is not output.

(Time t2) When the operating temperature Tj of the IGBT 2a has reached an overheat protection activation level L2 (for example, 175° C.), the alarm notification signal arm is output. In this connection, the IGBT 2a stops its switching operation during a time period tb during which the alarm notification signal arm is output.

(Time t3) When the operating temperature Tj of the IGBT 2a has fallen to an overheat protection reset level L3 (for example, 155° C.), the output of the alarm notification signal arm stops. Note that the time period tb during which the alarm notification signal arm is output continues until the operating temperature Tj of the IGBT 2a falls to the overheat protection reset level L3.

(Time t4) When the operating temperature Tj of the IGBT 2a has fallen to a warning reset level L4 (for example, 140° C.), the output of the warning notification signal w stops. Note that the time period to during which the warning notification signal w is output continues until the operating temperature Tj of the IGBT 2a falls to the warning reset level L4.

Second Embodiment

Figure 7:
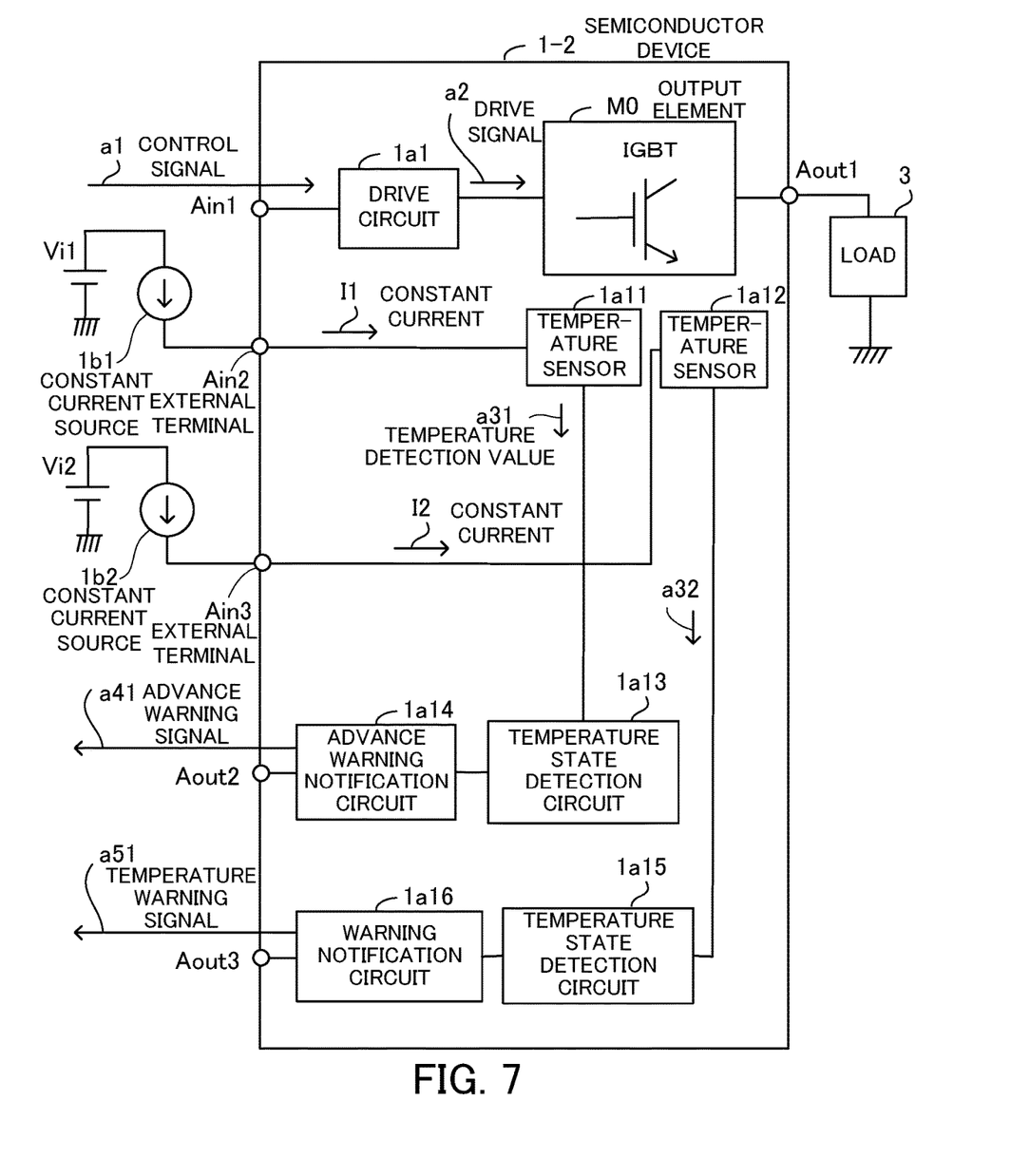
FIG. 7 is a view for describing an example of a semiconductor device according to a second embodiment.

FIG. 7 is a view for describing an example of a semiconductor device according to a second embodiment. The semiconductor device 1-2 includes an output element M0, a drive circuit 1a1, a temperature sensor 1a11 (first temperature sensor), a temperature sensor 1a12 (second temperature sensor), a temperature state detection circuit 1a13 (first temperature state detection circuit), a temperature state detection circuit 1a15 (second temperature state detection circuit), an advance warning notification circuit 1a14, and a warning notification circuit 1a16. In addition, the semiconductor device 1-2 includes an input terminal Ain1, an external terminal Ain2 (first external terminal), an external terminal Ain3 (second external terminal), and output terminals Aout1, Aout2, and Aout3.

The temperature sensor 1a11 operates with a constant current I1 received from the external terminal Ain2, detects the temperature of the output element M0, and outputs a temperature detection value a31 (first temperature detection value). The temperature sensor 1a12 operates with a constant current I2 received from the external terminal Ain2, detects the temperature of the output element M0, and outputs a temperature detection value a32 (second temperature detection value).

The temperature state detection circuit 1a13 compares the temperature detection value a31 with a first reference threshold and outputs a first temperature state. The temperature state detection circuit 1a15 compares the temperature detection value a32 with a second reference threshold and outputs a second temperature state.

When determining that the first temperature state is an abnormal level of the overheat warning state, the advance warning notification circuit 1a14 outputs an advance warning signal a41 from the output terminal Aout2. When determining that the second temperature state is an abnormal level of the overheat alarm state, the warning notification circuit 1a16 outputs a temperature warning signal a51 from the output terminal Aout3.

Here, the semiconductor device 1-2 includes the external terminals Ain2 and Ain3 as new terminals. The external terminal Ain2 is connected to a constant current source 1b1 and is configured to receive, from the outside, the constant current I1 output from the constant current source 1b1. The input terminal of the constant current source 1b1 is connected to a voltage source Vi1, and the output terminal of the constant current source 1b1 is connected to the external terminal Ain2. The constant current I1 output from the constant current source 1b1 is input to the temperature sensor 1a11.

In addition, the external terminal Ain3 is connected to a constant current source 1b2 and is configured to receive, from the outside, the constant current I2 output from the constant current source 1b2. The input terminal of the constant current source 1b2 is connected to a voltage source Vi2, and the output terminal of the constant current source 1b2 is connected to the external terminal Ain3. The constant current I2 output from the constant current source 1b2 is input to the temperature sensor 1a12.

As described above, in the semiconductor device 1-2, the constant current I1 to be input to the temperature sensor 1a11 used for detecting the overheat warning state (first temperature state) of the output element M0 is output from the constant current source 1b1 provided outside the semiconductor device 1-2, so as to control the temperature detection level for detecting the overheat warning state, on the basis of the constant current I1 received via the external terminal Ain2.

In addition, the constant current I2 to be input to the temperature sensor 1a12 used for detecting the overheat alarm state (second temperature state) of the output element M0 is output from the constant current source 1b2 provided outside the semiconductor device 1-2, so as to control the temperature detection level for detecting the overheat alarm state, on the basis of the constant current I2 received via the external terminal Ain3.

With the above configuration, it is possible to flexibly and easily change the warning temperature detection level and the alarm temperature detection level independently, at which a notification of an abnormal temperature state is made in the overheat protection function.

(Configuration of Semiconductor Device)

Figure 8:
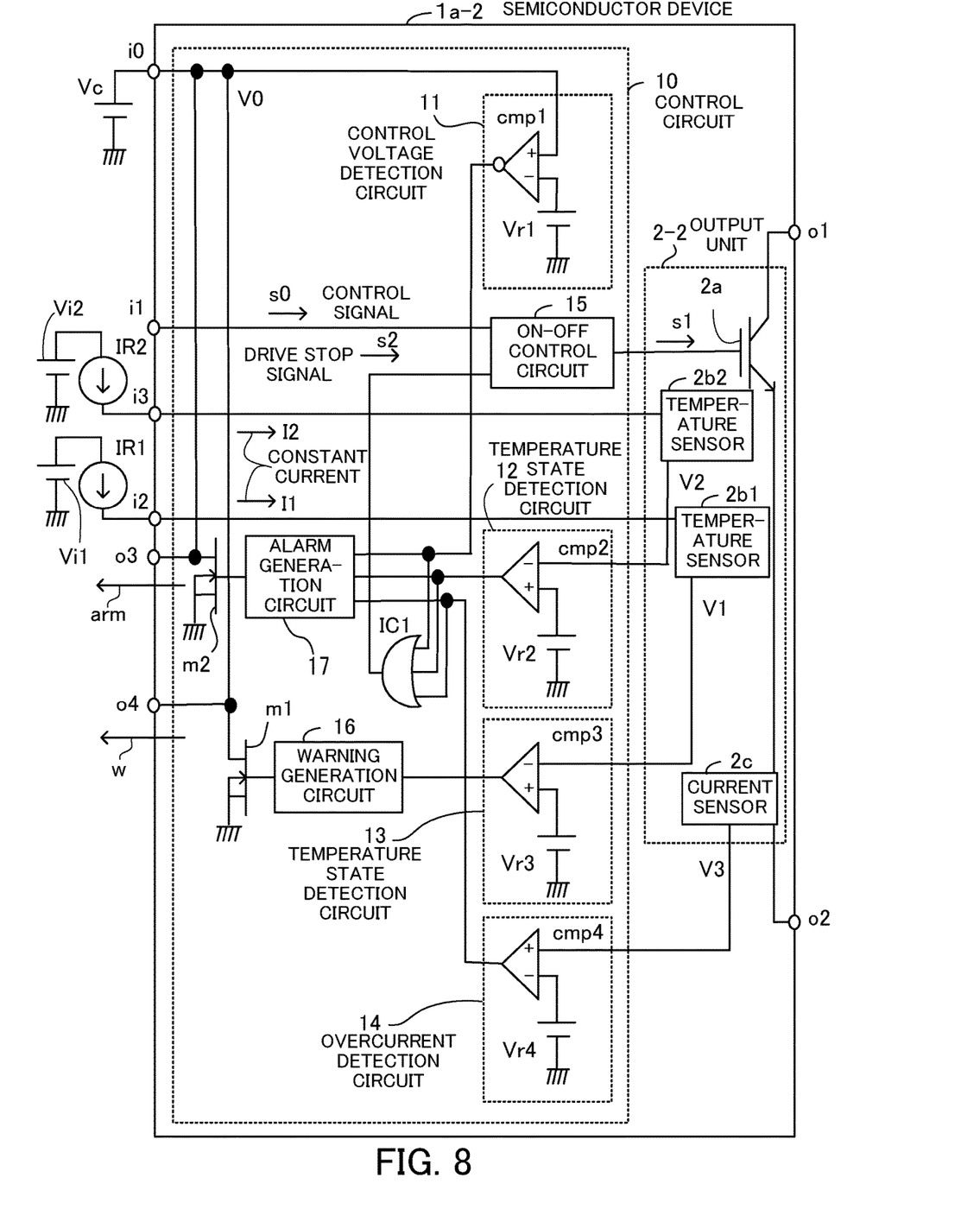
FIG. 8 illustrates an example of the configuration of a semiconductor device.

FIG. 8 illustrates an example of the configuration of a semiconductor device. The semiconductor device 1a-2 has the function of the semiconductor device 1-2 of FIG. 7. The semiconductor device 1a-2 includes input terminals i0 and i1, external terminals i2 and i3, and output terminals o1, . . . , o4 as input and output terminals, and also includes a control circuit 10 and an output unit 2-2. The output unit 2-2 includes an IGBT 2a, a temperature sensor 2b1, a temperature sensor 2b2, and a current sensor 2c.

A constant current source IR1 is connected to the external terminal i2. The input terminal of the constant current source IR1 is connected to a voltage source Vi1, and the output terminal of the constant current source IR1 is connected to the external terminal i2. A constant current I1 output from the constant current source IR1 is input to the temperature sensor 2b1 in the output unit 2-2. The temperature sensor 2b1 receives the constant current I1 from the constant current source IR1 connected to the external terminal i2 of the semiconductor device 1a-2, outputs a voltage signal V1 based on the operating temperature of the IGBT 2a, and detects a warning temperature level in the IGBT 2a.

A constant current source IR2 is connected to the external terminal i3. The input terminal of the constant current source IR2 is connected to a voltage source Vi2, and the output terminal of the constant current source IR2 is connected to the external terminal i3. A constant current I2 output from the constant current source IR2 is input to the temperature sensor 2b2 in the output unit 2-2. The temperature sensor 2b2 receives the constant current I2 from the constant current source IR2 connected to the external terminal i3 of the semiconductor device 1a-2, outputs a voltage signal V2 based on the operating temperature of the IGBT 2a, and detects an alarm temperature level in the IGBT 2a. The other configuration is the same as that of FIG. 2.

As described above, the present embodiment provides a configuration such that a constant current to be input to a temperature sensor used for detecting an overheat state of an output element is output from a constant current source provided outside a semiconductor device, so as to control a temperature detection level. This configuration makes it possible to flexibly and easily change the temperature detection level at which a notification of an abnormal temperature state is made in the overheat protection function.

In this connection, for a device that has an overload mode, an IPM is usable at an operating case temperature of 125° C. or lower, at a chip joint operating temperature (a temperature allowing continuous operation) of 150° C. or lower, and at a chip joint temperature (allowed to be reached instantly) of 175° C. or lower in the overload mode. For such setting, the minimum temperature for warning is set to 150° C. and the minimum temperature for chip overheat protection is set to 175° C.

In addition, for a device without an overload mode, when the temperatures in the above setting are high, there is a demand that warning and protection be performed at lower temperatures. This demand may be satisfied by lowering the constant current. For example, the temperature for warning may be set to the operating case temperature of 125° C., and the temperature for chip overheat protection in this case may be set to 150° C. that allows continuous operation.

In addition, with respect to the device with the overload mode, some users would like to avoid a situation where the IPM is stopped by chip overheat protection when a very rare abnormality occurs. To satisfy this demand, the temperature for warning is set to the chip joint temperature (allowed to be reached instantly) of 175° C. By doing so, it is possible to detect the maximum temperature without activating the chip protection.

Heretofore, the embodiments have been described. Each component in the embodiments may be replaced with another component having an equivalent function. In addition, other desired configurations and steps may be added. In addition, two or more desired configurations (features) in the embodiments described above may be combined.

According to one aspect, it is possible to flexibly and easily change a detection level at which a notification of an abnormal temperature state is made in an overheat protection function.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device for operating a load, comprising:
   an output element connected to the load and configured to perform switching to operate the load;
   a drive circuit configured to output a drive signal to the output element, to thereby cause the output element to perform the switching;
   an external terminal configured to be connected to a constant current source that is external to the semiconductor device, and to receive a constant current output from the constant current source;
   a temperature sensor connected to the external terminal and configured to
   operate with the constant current,
   detect a temperature of the output element, and
   output a temperature detection value;
   a temperature state detection circuit configured to output a temperature state of the output element, based on a result of comparing the temperature detection value with a reference threshold; and
   an abnormal level notification circuit configured to send out a notification upon determining that the temperature state is at an abnormal level.

2. The semiconductor device according to claim 1, wherein the temperature state detection circuit includes
   a first temperature state detection circuit that compares the temperature detection value with a first reference threshold and outputs a first temperature state indicating a first temperature, and
   a second temperature state detection circuit that compares the temperature detection value with a second reference threshold and outputs a second temperature state indicating a second temperature that is higher than the first temperature, the second reference threshold being lower than the first reference threshold.

3. The semiconductor device according to claim 2, wherein the abnormal level notification circuit includes
   an advance warning notification circuit that outputs an advance warning signal upon determining that the first temperature state is at a first abnormal level, and
   a warning notification circuit that outputs a temperature warning signal upon determining that the second temperature state is at a second abnormal level.

4. The semiconductor device according to claim 3, further comprising:
   a control voltage detection circuit configured to detect a voltage level of a control voltage received by the semiconductor device; and
   an overcurrent detection circuit configured to detect a current state of the output element,
   wherein the control voltage detection circuit detects a control voltage drop abnormal level indicating that the control voltage has dropped, by comparing the control voltage with a control voltage detection reference threshold, and
   wherein the overcurrent detection circuit detects an abnormal overcurrent level indicating that the output element is in an overcurrent state, by comparing a voltage signal indicating the current state of the output element with an overcurrent detection reference threshold.

5. The semiconductor device according to claim 4, wherein the warning notification circuit
   outputs a control voltage drop warning signal in response to the control voltage drop abnormal level being detected, and
   outputs an overcurrent warning signal in response to the abnormal overcurrent level being detected.

6. The semiconductor device according to claim 5, wherein the drive circuit turns off the output element to stop an operation of the output element, in response to any one of the temperature warning signal, the control voltage drop warning signal, and the overcurrent warning signal being output.

7. A semiconductor device for operating a load, comprising:
   an output element connected to the load and configured to perform switching to operate the load;
   a drive circuit configured to output a drive signal to the output element, to thereby cause the output element to perform the switching;
   a first external terminal configured to be connected to a first constant current source that is external to the semiconductor device, and to receive a first constant current output from the first constant current source;

a second external terminal configured to be connected to a second constant current source that is external to the semiconductor device, and to receive a second constant current output from the second constant current source;

a first temperature sensor connected to the first constant current source and configured to
operate with the first constant current,
detect a temperature of the output element, and
output a first temperature detection value;

a second temperature sensor connected to the second constant current source and configured to
operate with the second constant current,
detect the temperature of the output element, and
output a second temperature detection value;

a first temperature state detection circuit configured to compare the first temperature detection value with a first reference threshold and output a first temperature state indicating a first temperature;

a second temperature state detection circuit configured to compare the second temperature detection value with a second reference threshold and output a second temperature state indicating a second temperature that is higher than the first temperature, the second reference threshold being lower than the first reference threshold;

an advance warning notification circuit configured to output an advance warning signal upon determining that the first temperature state is at a first abnormal level; and a warning notification circuit configured to output a temperature warning signal upon determining that the second temperature state is at a second abnormal level.

8. The semiconductor device according to claim 7, further comprising:

a control voltage detection circuit configured to detect a voltage level of a control voltage received by the semiconductor device; and an overcurrent detection circuit configured to detect a current state of the output element, wherein the control voltage detection circuit detects a control voltage drop abnormal level indicating that the control voltage has dropped, by comparing the control voltage with a control voltage detection reference threshold, and wherein the overcurrent detection circuit detects an abnormal overcurrent level indicating that the output element is in an overcurrent state, by comparing a voltage signal indicating the current state of the output element with an overcurrent detection reference threshold.

9. The semiconductor device according to claim 8, wherein the warning notification circuit outputs a control voltage drop warning signal in response to the control voltage drop abnormal level being detected, and outputs an overcurrent warning signal in response to the abnormal overcurrent level being detected.

10. The semiconductor device according to claim 9, wherein the drive circuit turns off the output element to stop an operation of the output element, in response to any one of the temperature warning signal, the control voltage drop warning signal, and the overcurrent warning signal being output.

* * * * *